United States Patent
Ichimura et al.

(10) Patent No.: US 10,074,506 B2
(45) Date of Patent: Sep. 11, 2018

(54) METHOD FOR MANUFACTURING ELECTRON SOURCE

(71) Applicant: Hitachi High-Techonologies Corporation, Minato-ku, Tokyo (JP)

(72) Inventors: Takashi Ichimura, Tokyo (JP); Hisao Nitta, Tokyo (JP); Nobuyuki Sonobe, Tokyo (JP); Boklae Cho, Tokyo (JP); Hisaya Murakoshi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 633 days.

(21) Appl. No.: 14/434,824

(22) PCT Filed: Oct. 12, 2012

(86) PCT No.: PCT/JP2012/076381
§ 371 (c)(1),
(2) Date: Apr. 10, 2015

(87) PCT Pub. No.: WO2014/057570
PCT Pub. Date: Apr. 17, 2014

(65) Prior Publication Data

US 2015/0255240 A1    Sep. 10, 2015

(51) Int. Cl.
*H01J 37/065* (2006.01)
*H01J 1/16* (2006.01)
(Continued)

(52) U.S. Cl.
CPC .............. *H01J 37/065* (2013.01); *C25F 3/26* (2013.01); *H01J 1/16* (2013.01); *H01J 1/3044* (2013.01);
(Continued)

(58) Field of Classification Search
CPC ..... C25F 3/26; H01J 37/065; H01J 1/16; H01J 1/3044; H01J 9/025; H01J 9/042
See application file for complete search history.

(56) References Cited

U.S. PATENT DOCUMENTS

| 5,993,636 A | 11/1999 | Terui et al. |
| 2011/0240855 A1* | 10/2011 | Ohshima ............... H01J 37/065 250/310 |
| 2012/0269326 A1* | 10/2012 | Adler ...................... H01J 35/08 378/138 |

FOREIGN PATENT DOCUMENTS

| JP | 8-36981 A | 2/1996 |
| JP | 08036981 A * | 2/1996 |
| JP | 2789610 B2 * | 8/1998 |
| JP | 2789610 B2 | 8/1998 |
| JP | 10-255703 A | 9/1998 |

(Continued)

OTHER PUBLICATIONS

International Search Report (PCT/ISA/210) dated Nov. 20, 2012 with English translation (five pages).

(Continued)

*Primary Examiner* — Nicholas A Smith
(74) *Attorney, Agent, or Firm* — Crowell & Moring LLP

(57) ABSTRACT

A conventional method to process a tip fails to designate the dimension of the shape of the end of the tip, and so fails to obtain a tip having any desired diameter. Impurities may be attached to the tip. Based on a correlation between the voltage applied or the time during processing of the end of the tip and the diameter of the tip end, the applied voltage is controlled so as to obtain a desired diameter of the tip end for processing of the tip. This allows a sharpened tip made of a tungsten monocrystal thin wire to be manufactured to have any desired diameter in the range of 0.1 μm or more and 2.0 μm or less.

18 Claims, 12 Drawing Sheets

(51) Int. Cl.
  *H01J 1/30* (2006.01)
  *H01J 9/02* (2006.01)
  *H01J 9/04* (2006.01)
  *C25F 3/26* (2006.01)
  *H01J 1/304* (2006.01)
  *H01J 37/073* (2006.01)
  *H01J 37/06* (2006.01)
  *H01J 37/285* (2006.01)

(52) U.S. Cl.
  CPC .............. *H01J 9/025* (2013.01); *H01J 9/042* (2013.01); *H01J 37/06* (2013.01); *H01J 37/073* (2013.01); *H01J 37/285* (2013.01); *H01J 2237/063* (2013.01); *H01J 2237/06316* (2013.01); *H01J 2237/06341* (2013.01)

(56) References Cited

FOREIGN PATENT DOCUMENTS

| JP | 10255703 A | * | 9/1998 |
| JP | 11-31453 A | | 2/1999 |
| JP | 2005-339922 A | | 12/2005 |
| JP | 2008-177017 A | | 7/2008 |
| JP | 2008-293844 A | | 12/2008 |
| JP | 2009-301920 A | | 12/2009 |
| JP | 2011-124099 A | | 6/2011 |

OTHER PUBLICATIONS

Japanese-language Written Opinion (PCT/ISA/237) dated Nov. 20, 2012 (four pages).
Chinese-Language Office Action issued in counterpart Chinese Application No. 201280076337.X dated Sep. 13, 2016 (6 pages).

* cited by examiner

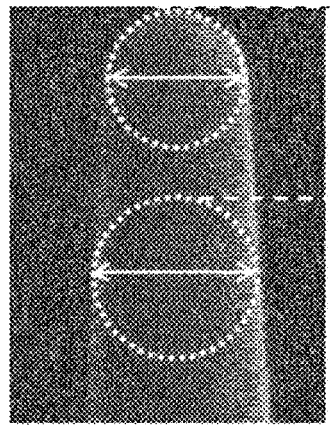
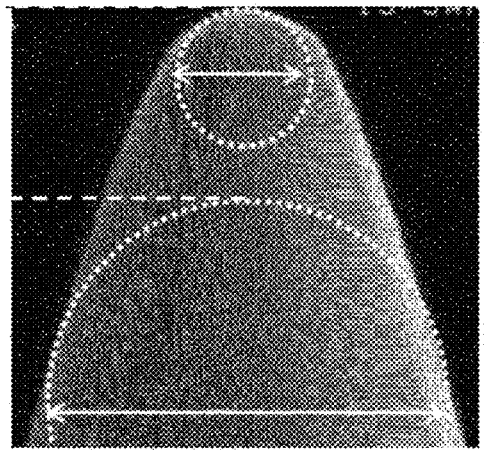
Tip having a small cone angle
Tip having a large cone angle
FIG. 13A
FIG. 13B

METHOD FOR MANUFACTURING ELECTRON SOURCE

TECHNICAL FIELD

The present invention relates to a method for manufacturing an electron source, and relates to a method for adjusting the diameter of a tip end, serving mainly as an electron source, to have a desired size. The thus processed tip is used for equipments that operate with electrons extracted into vacuum, such as electron microscope, electron beam application device such as electron beam lithography system, probe microscope such as Scanning Tunneling Microscope (STM), in which the tunneling current is used, and Atom Force Microscope (AFM), in which the atom force is used, and in other way ion microscope in order to observe, manufacture and inspect the specimen.

BACKGROUND ART

When intense electric field is applied to the surface of metal, potential level is inclined at the vacuum. Then when the electric field exceeds the order of $10^9$ V/m, the potential barrier becomes extremely thin, so that electrons are emitted into vacuum due to the tunneling-effect. This is called field emission. When intense electric field with the order of over $10^8$ V/m is applied to the surface of heated metal, the Schottky effect occurs, and then electrons are emitted into vacuum. Recently as the electron source of a high-resolution electron microscope, a field-emission electron source based on the field emission phenomenon (Cold Field Emitter: CFE) and a Schottky electron source based on the Schottky effect (Schottky Emitter: SE) are mainly used.

In order to emit an electron beam from an electron source, such as CFE and SE, the diameter of the electron source at the tip end has to be thin in the nanometer order because sufficiently intense electric field is applied to the tip end. Conventionally a typical electron source is manufactured by sharpening a metal thin wire at the end by electrolytic polishing. Electrolytic polishing is a technique to sharpen the metal wire in electrolyte, applying voltage for electrolysis to melt the metal wire. In case of using SE, it is required to have a proper diameter of electron source at the tip end according to the property such as the amount of the beam current, the width of the beam energy, the stability of the beam and so on. And as other methods to sharpen the wire, there are various methods such as heat-treating, dry etching and ion etching in order to have the desired diameter.

JP H11-31453 A, for example, discloses a method of manufacturing a tip by electrolytic polishing. JP H08-36981 A discloses a method of heat-treating of a sharpened thin wire, dry etching, and etching by the ions which are ionized gas by electrons, which are emitted from tungsten monocrystal wire by applying voltage as a cathode. JP 2008-177017 A discloses a method of processing a tip end by FIB.

CITATION LIST

Patent Literatures

Patent Literature 1: JP H11-31453 A (U.S. Pat. No. 5,993,636)
Patent Literature 2: JP H08-36981 A
Patent Literature 3: JP 2008-177017 A

SUMMARY OF INVENTION

Technical Problem

There is a need for analysis of compositions and components of a specimen these days in the field of electron microscopes. Such an analysis needs to focus a large current on a specimen, meaning that the large current has to be emitted from an electron source. A conventional electron source having the diameter of 0.8 μm or less at the end is good for high-resolution observation of a specimen with a small current. For emission of the larger current, however, it has problems of an increase in chromatic aberration resulting from the wider energy width and of poor current stability, and so fails to emit with a large current.

Then, a thick electron source having the diameter at the end of 0.8 μm or more is devised as the electron source for analysis. Such an electron source can have widen emission site of electrons, and can minimize the electrons interaction, and emit a large current while decreasing the energy width.

Then a method of controlling the diameter of the tip end is required. The aforementioned methods, however, have the following problems. That is, the method of the electrolytic polishing yields a diameter at the tip end in the nanometer order, which is too small for electron sources. In the method of heat treating, the shape of the tip end after electrolytic polishing affects the diameter at the tip end, and a size error is quite large. In the methods of dry etching and ion etching, the diameter at the tip end is not controlled, meaning that a tip cannot be manufactured by designating the size, and so a tip having a desired diameter cannot be acquired. When the tip end is precisely-processed by FIB, impurities may be attached to the tip, and so these methods cannot be used.

Solution to Problem

In order to fulfill the above object, current is allowed to flow through a heating element in vacuum to heat a tip, and negative voltage relative to the electrode disposed in front of the tip is applied to the tip to process the tip end. Herein, based on a substantially proportional relationship between the voltage and the diameter at the end, the voltage is controlled to have a desired diameter at the end, whereby the tip end is adjusted for processing. Then, heat treatment may be performed after this processing, whereby crystal defects occurring at the tip end or the surface roughness during processing may be corrected, and the tip end can be controlled in size to have a diameter at the end that is larger than that manufactured only by this processing.

Advantageous Effects of Invention

While a conventional technique fails to manufacture a tip having a designated diameter at the end, the present invention as stated above can manufacture a sharpened tip made of a tungsten monocrystal thin wire to have any desired diameter in the range from 0.1 μm to 2.0 μm. Since this manufacturing method does not include FIB, impurities are not attached to the tip.

BRIEF DESCRIPTION OF DRAWINGS

FIGS. 13A and 13B illustrate tips having a small cone angle and a large cone angle.

DESCRIPTION OF EMBODIMENTS

The following describes embodiments of the present invention, with reference to the drawings. In the present invention, a tip is processed by a method in which a change in current over time that is emitted from the tip end is monitored during the processing of the tip at the end, and voltage is increased so as to the voltage corresponding to a desired diameter of the tip end and then the processing is stopped in appropriate processing time.

Embodiments of the present invention are described below, with reference to the drawings.

Figure 1:
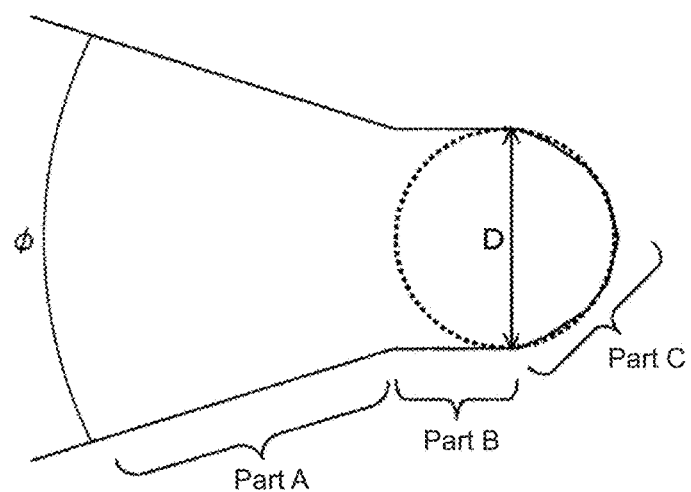
FIG. 1 illustrates a shape of a tip at the end.

As illustrated in FIG. 1, the end of a tip can be divided into a conical part A, a cylindrical part B and a semispherical part C. In some cases, part B is extremely short or is not existed. In the following description, the diameter at the tip end refers to the diameter of a sphere inscribed in the end of the tip.

Embodiment 1

Figure 2:
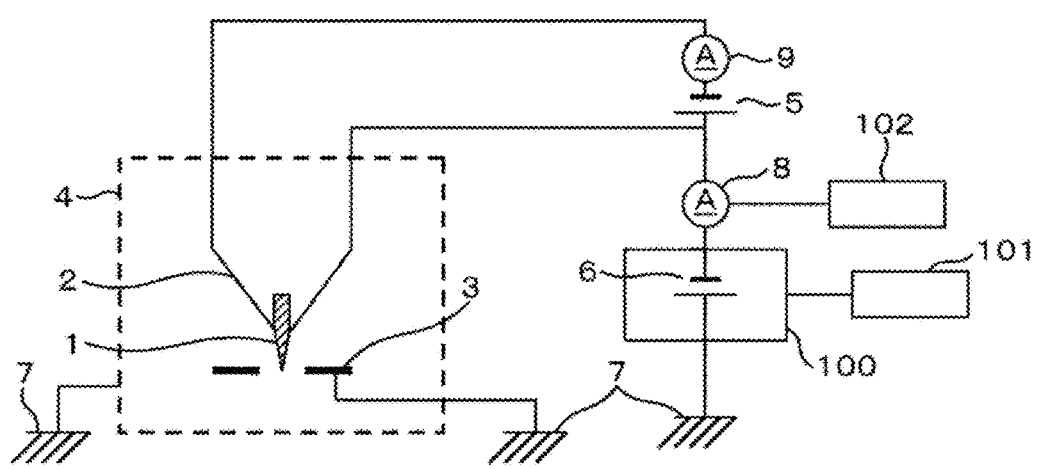
FIG. 2 is a conceptual diagram of a device for processing.
Figure 3:
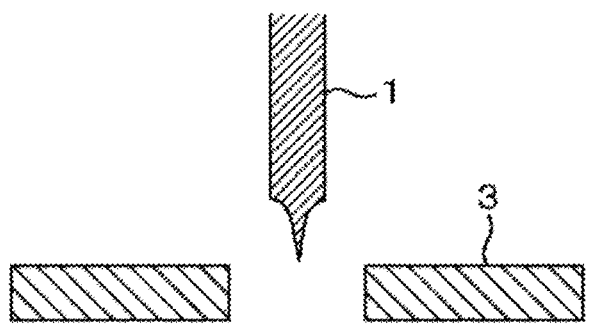
FIG. 3 illustrates surroundings of the tip in details.

FIG. 2 is a conceptual diagram of a device to process a tip. A tip 1 having a sharpened tip end of a tungsten monocrystal thin wire whose axial orientation is <100> that is sharpened by electrolytic polishing is fixed to a heating element 2, which is then disposed in a vacuum vessel 4. The heating element 2 is connected to a voltage power supply 6 to apply voltage to the tip 1, an ammeter 8 to measure the current emitted from the tip 1, and a current power supply 5 to heat the heating element. Then an extraction electrode 3 at the ground potential is disposed in the vicinity of the tip 1, and so when voltage is applied to the heating element 2, electric field is generated between the tip 1 and the extraction electrode 3. FIG. 3 illustrates surroundings of the tip in details.

The vacuum vessel 4 is evacuated to the pressure from about $10^{-4}$ Pa to $10^{-2}$ Pa, and the major component of the residual gas is water. In the present embodiment, a tip can be easily processed without the necessity of introducing gas for processing especially, and another gas may be introduced if ions can be generated for the processing of a tip, where the type of the gas may be selected. Although the pressure may be in the low-vacuum state of $10^{-2}$ Pa or more, such pressure may cause discharge that leads to ionization of the residual gas like avalanche. Although the pressure may in the high-vacuum state of $10^{-4}$ Pa or less, such pressure decreases the possibility of ionization of the residual gas, which may lead to the possibility that the processing of a tip end does not progress. In this way, the pressure from $10^{-2}$ to $10^{-4}$ Pa is conceivably optimum for processing of a tip.

Current is allowed to flow through the heating element 2 to heat the tip 1 in the range from 1,500 K to 2,000 K. Such temperatures do not change the atomic structure of the inside of the tip 1, but allows atoms at the surface of the tip at the end only to move, which is called atom migration. At the temperatures of 1,500 K or less, the emission current is small so that the processing may not progress, and at the temperatures of 2,000 K or more, atoms at the surface of the tip at the end move a lot, causing a change in diameter at the tip end and so it is difficult to control the diameter. In this way, the range of 1,500 K to 2,000 K is conceivably appropriate for processing. The appropriate temperature range may vary with the material of a tip, and so appropriate temperatures have to be investigated for a tip made of another material so as to allow atoms at the surface to move without changing the atomic structure.

Figure 4:
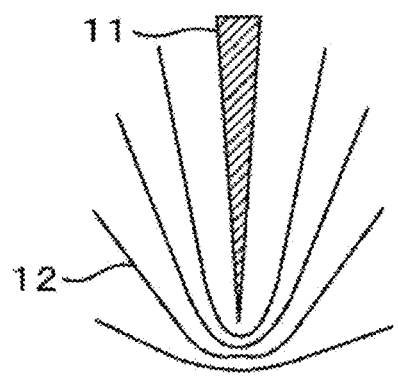
FIG. 4 illustrates the state of electric field around the tip.

When negative voltage relative to the extraction electrode 3 is applied to the tip, electric field is generated around the tip 1. FIG. 4 illustrates the state around the tip. When voltage is applied to the tip 1, electric field is generated between the tip and the extraction electrode 3, where the electric field is concentrated on the end of the tip 1. When the voltage reaches at about 2 kV, then current of a few µA to a few tens of µA is detected by the ammeter 8. This current is the sum of the current due to electrons emitted from the tip and the current due to the residual gas ionized, which collides with the tip. The electrons emitted from the tip include the electrons emitted by field emission and electrons emitted by Schottky effect. These electrons can be calculated theoretically, and one value can be given by the following expression when the temperature of the tip and the field intensity are decided:

$$J_s = \frac{4\pi m_e (kT)^2}{h^3} \exp\left( \frac{e^{3/2} F^{1/2}}{(4\pi\varepsilon_0)^{1/2} kT} - \frac{\phi}{kT} \right) \quad \text{(expression 1)}$$

Figure 5:
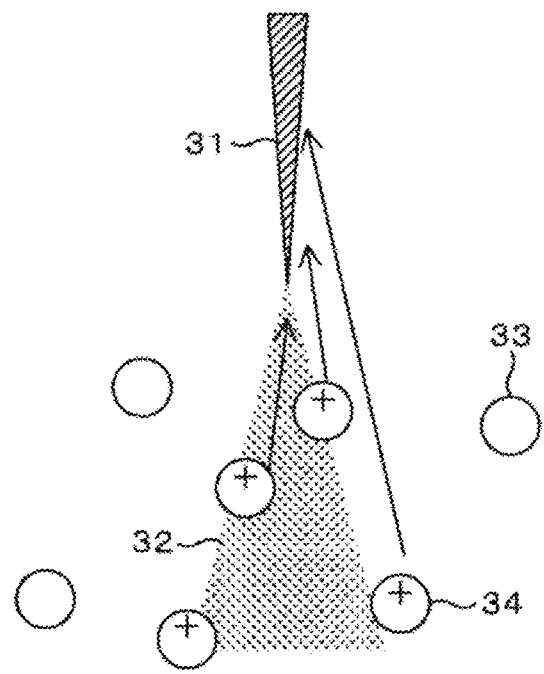
FIG. 5 illustrates the state where the ionized residual gas collides with the tip.
Figure 6:
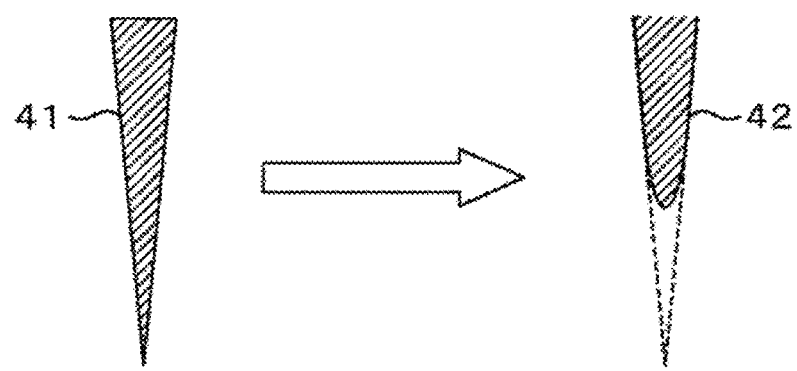
FIG. 6 illustrates the state where the tip end is rounded.

Js: Current density, $m_e$, k, j, e, $\varepsilon_0$: Physical constants, $\phi$: Work function, F: Electric field intensity, T: temperature Out of the residual gases ionized, residual gas 34 positively ionized collides with the tip end 31 to grind the surface of the tip and so round the tip end. FIG. 5 illustrates the state where the residual gas 34 positively ionized collides with the tip end 31, and FIG. 6 illustrates the state where the tip end is rounded by collision with ions.

Figure 7:
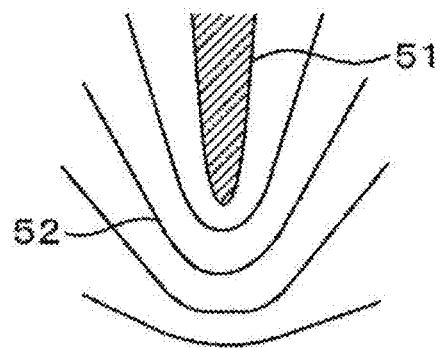

When the tip is ground and the tip end becomes round, then the electric field around the tip is weakened, and so the electric field concentrated on the surrounding of the tip is weakened. FIG. 7 illustrates the state.

Figure 8:
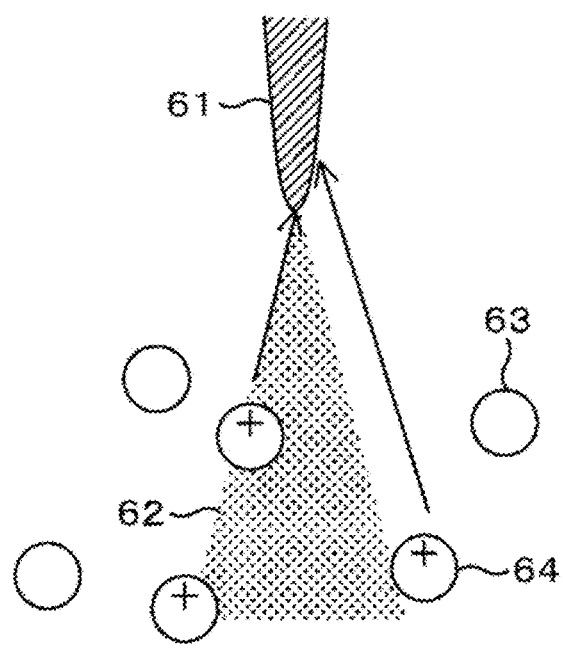
FIG. 8 illustrates the state of decreased ions that collide with the tip.

When the electric field applied around the tip is weakened, the number of electrons emitted by field emission decreases in an exponential manner as is expected from expression 1, and so the current emitted from the tip decreases, and the electric filed is weakened. This means a decrease of the residual gas ionized, and so the number of ions colliding with the tip decreases. FIG. 8 illustrates the state.

Figure 9:
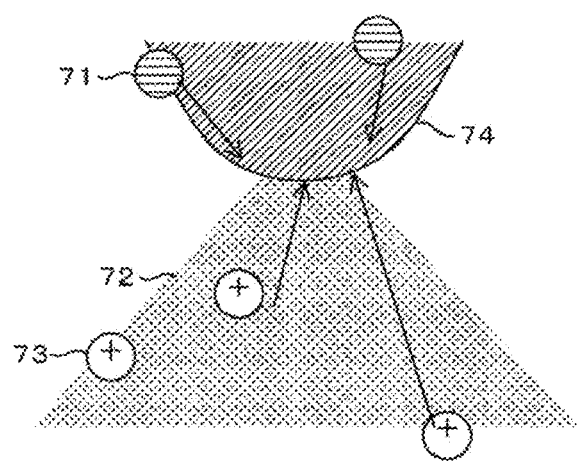
FIG. 9 illustrates the expanded state of the tip surface.

Since the tip is heated to move atoms at the surface, the ground part of the tip by the collision will be filled with the atoms. The rate of grinding of the tip surface by ions and the rate of filling of the ground part by the movement of atoms at the surface reaches the equilibrium state, and then the tip has a shape of a certain thickness. At this time, the electric field around the tip does not change apparently. FIG. 9 illustrates the state where the tip end shape is in the equilibrium state. When voltage is increased again, the emission current increases, and so the diameter at the tip end increases again to be in the equilibrium state. When voltage is increased again, the diameter at the tip end increases again to be in the equilibrium state, and so the correlation between the voltage and the diameter at the tip end can have substantially a proportional relationship.

Figure 10:
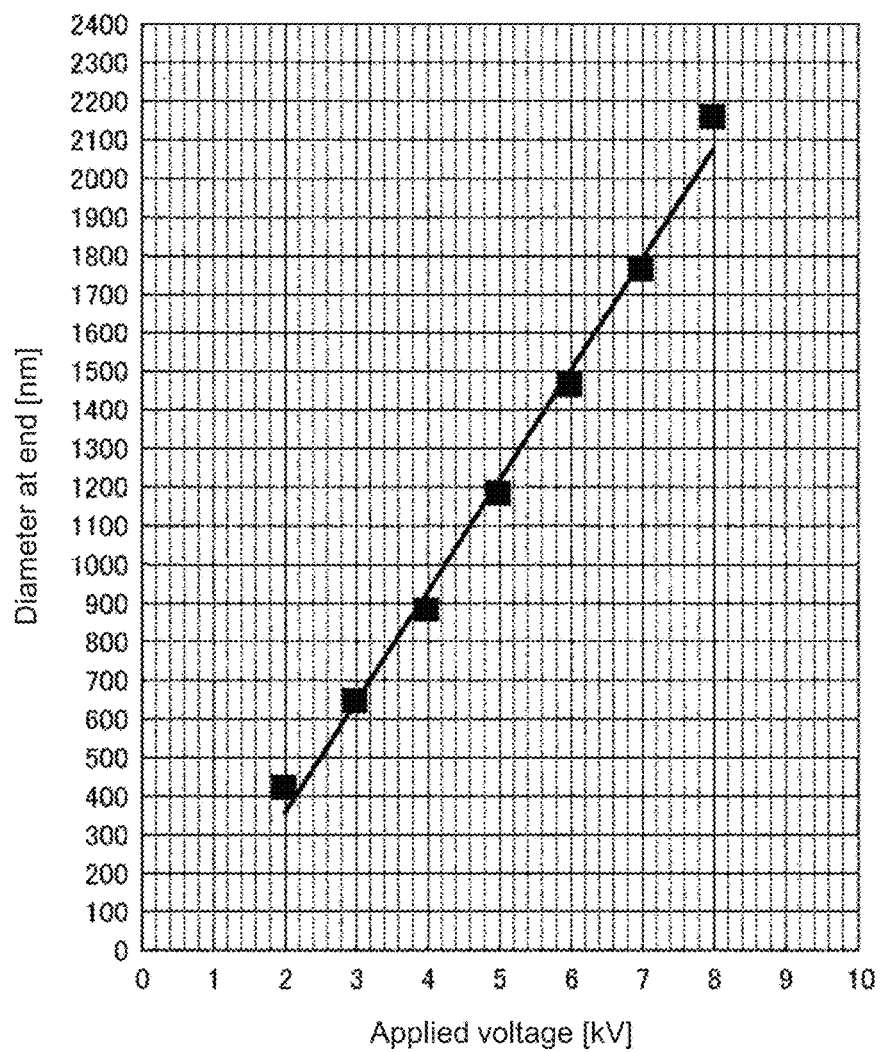
FIG. 10 is a graph obtained by plotting voltage applied to the tip and the diameters of the tip at the end.

Then the relationship between the voltage and the diameter at the tip end at this time is investigated, and the result is as illustrated in the graph of FIG. 10. Voltage and diameters at the tip end are plotted in the horizontal axis and the vertical axis, respectively, showing that they have a substantially proportional relationship. It can be found from this graph that voltage applied to the tip may be controlled to process the tip to have a desired diameter at the tip end. That is, a voltage power-supply controller 100 may control the applied voltage so that, when a desired diameter at the tip end is input to an input device 101, voltage corresponding to the input value is output, whereby the tip can be processed to have a desired diameter at the end.

Figure 11:
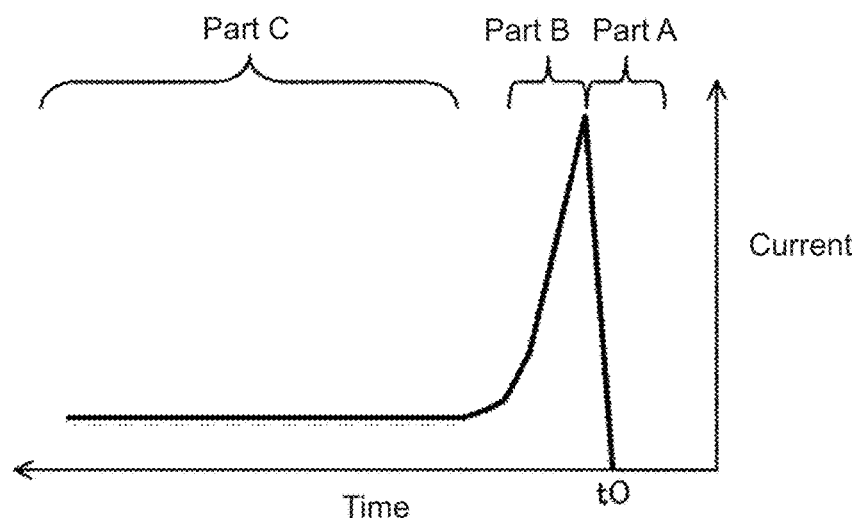
FIG. 11 is a chart representing a change over time in diameter of the tip end.

Further a change over time in sum of the current emitted from the tip end and the current due to residual gas ionized is monitored during the processing of the tip end. FIG. 11 roughly illustrates the chart representing a change over time in the emission current from the tip. The time progresses from right to left. When voltage is applied at time t0, then the current increases due to electric field around the tip as illustrated in FIG. 4 (part A). Subsequently, the tip is rounded as illustrated in FIG. 6, and so the electric field is weakened, and the current decreases in an exponential manner (part B). Then the rate of grinding the tip surface by ions and the rate of filling the ground part with atoms moving at the surface have an equilibrium state over time as illustrated in FIG. 8. Then the tip shape is in the equilibrium state, and so the electric field at the tip surface becomes substantially uniform and the current becomes constant (part C).

A change in current over time is monitored in this way because of the following two reasons. Firstly, if high voltage is applied suddenly to the tip end when the diameter at the tip end is still small before the grinding, then discharge may occur in such a manner that residual gas is ionized like avalanche. When the applied voltage corresponding to the diameter at the tip end exceeds 2 kV, the voltage has to be increased in a step-by-step manner so as not to increase the current too large, and after confirming that the diameter at the tip end is large enough to avoid the discharge, then the voltage may be increased. In the present embodiment, the voltage is increased in a step-by-step manner so as to keep the current at 50 µA or less. Secondly, monitoring of a change in current over time allows an operator to know indirectly that the processing at the tip end starts when the current increases, and that the processing at the tip end reaches its final stage when the current decreases and becomes constant and is in the equilibrium state. That is, although a change in diameter at the tip end cannot be known during the processing of a tip in conventional techniques, the monitoring of current allows an operator to know the progress of the processing of the tip end, and enables visualization of a change in diameter at the tip end.

In Embodiment 1, the processing time is set until the current becomes constant. However, the processing rate is substantially constant irrespective of individual differences of tips, and so the processing time may not be limited to the time until the current becomes constant. The processing time may be set at any time, and a graph similar to FIG. 10 can be drawn. Then, voltage to yield a desired diameter at the tip end may be decided from the graph, whereby a tip of any diameter at the end can be processed.

Embodiment 2

Figure 12:
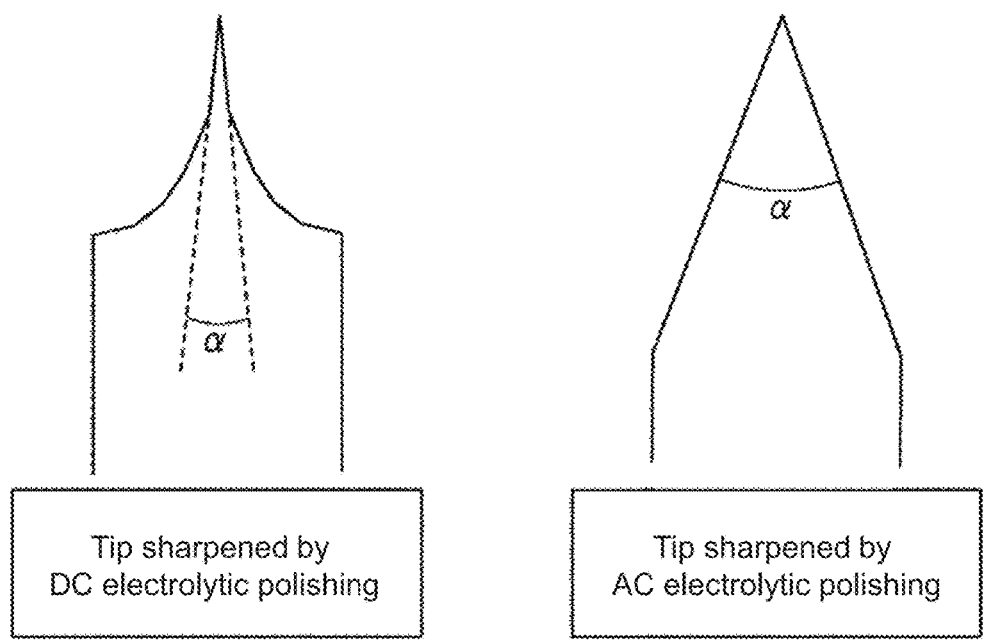
FIG. 12 illustrates tips finished by DC and AC electrolytic polishing.

Electrolytic polishing is a technique of soaking a thin wire into electrolyte solution, followed by application of voltage, thus fabricating a sharpened tip end, and at this time, the tip end has a different shape between DC voltage and AC voltage applied (hereinafter polishing by DC voltage is called DC electrolytic polishing, and polishing by AC voltage is called AC electrolytic polishing). When a tungsten monocrystal thin wire having axial orientation of <100> is polished, the resultant tip end has a different angle at the conical part (cone angle) between the DC electrolytic polishing and the AC electrolytic polishing. FIG. 12 illustrates such a difference. When the tip end is sharpened by DC electrolytic polishing, the tip end is polished like a curve, and the cone angle α is 10° or less. When such a tip is sharpened by the method described in Embodiment 1, the processing can be performed so that the resultant tip has the cone angle of 10° or less, and the diameter at the tip end is a desired value of 0.1 to 2.0 µm. On the other hand, when the tip end is sharpened by AC electrolytic polishing, the cone angle of the tip can be made large of 15° or more. When such a tip is sharpened by the method described in Embodiment 1, the processing can be performed so that the resultant tip has the cone angle of 15° or more, and the diameter at the tip end is a desired value of 0.1 to 2.0 µm.

When a tip having the cone angle of 10° or less is used as an electron source, deformation of the tip end due to atoms moving at the surface is less, meaning good stability of the emission current. When the cone angle is small, electric field generated around the tip easily is concentrated on the tip when voltage is applied to the tip. That is, this has advantages that a power supply of small capacity is enough to emit a certain amount of current and problems about discharge with another component hardly occur.

When the cone angle is large, the diameter at the tip end easily changes, meaning poor stability of emitted current. FIG. 13 illustrates the state of a change in diameter at the tip end when the tip is deformed. FIG. 13 illustrates photos of tips, where the same circles are inscribed in the tip end and cone angles are different. It is found that the tip (a) having a small cone angle has a small change in diameter at the tip end as compared with the tip (b) having a large cone angle, when their tip ends are shifted backward by the same amount.

That is, a thin wire sharpened by DC electrolytic polishing can have a cone angle that is freely set at a small size, and the thus obtained thin wire by electrolytic polishing may be processed by the method similar to Embodiment 1, whereby a tip having a small cone angle and having high stability for emitted current can be processed to have a desired diameter at the tip end of 0.1 to 2.0 µm.

Embodiment 3

Figure 14:
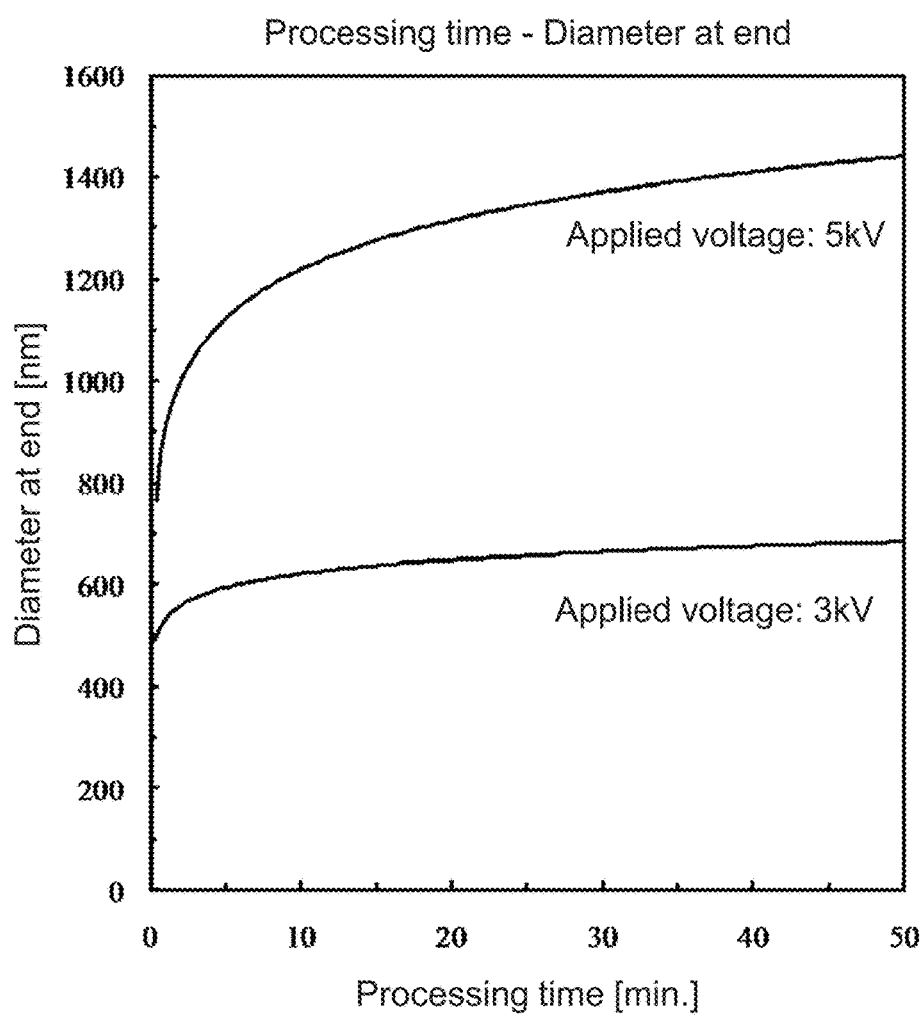
FIG. 14 is a graph illustrating the relationship between the processing time and the diameter at the end.

Although the processing time of a tip is set at a certain time in the method of Embodiment 1, the processing time may be used as a parameter to control the diameter at the tip end while setting the applied voltage constant. FIG. 14 is a graph by plotting the diameter at the end of a tip while stopping the processing of the tip at time intervals (processing time) measured since immediately after the application of voltage, where the applied voltage is set at 5 kV and 3 kV. The horizontal axis represents the processing time, and the vertical axis represents the diameter at tip end. The diameter at tip end increases in a logarithm function manner as the processing time increases, and then is saturated gradually. This saturated state means the state where the diameter of the tip end is fixed to a certain thickness, and the diameter at the tip end increases with an increase in applied voltage. The processing may end at any processing time before the saturated state so as to control the diameter at the tip end to have a desired diameter.

Embodiment 4

Figure 15:
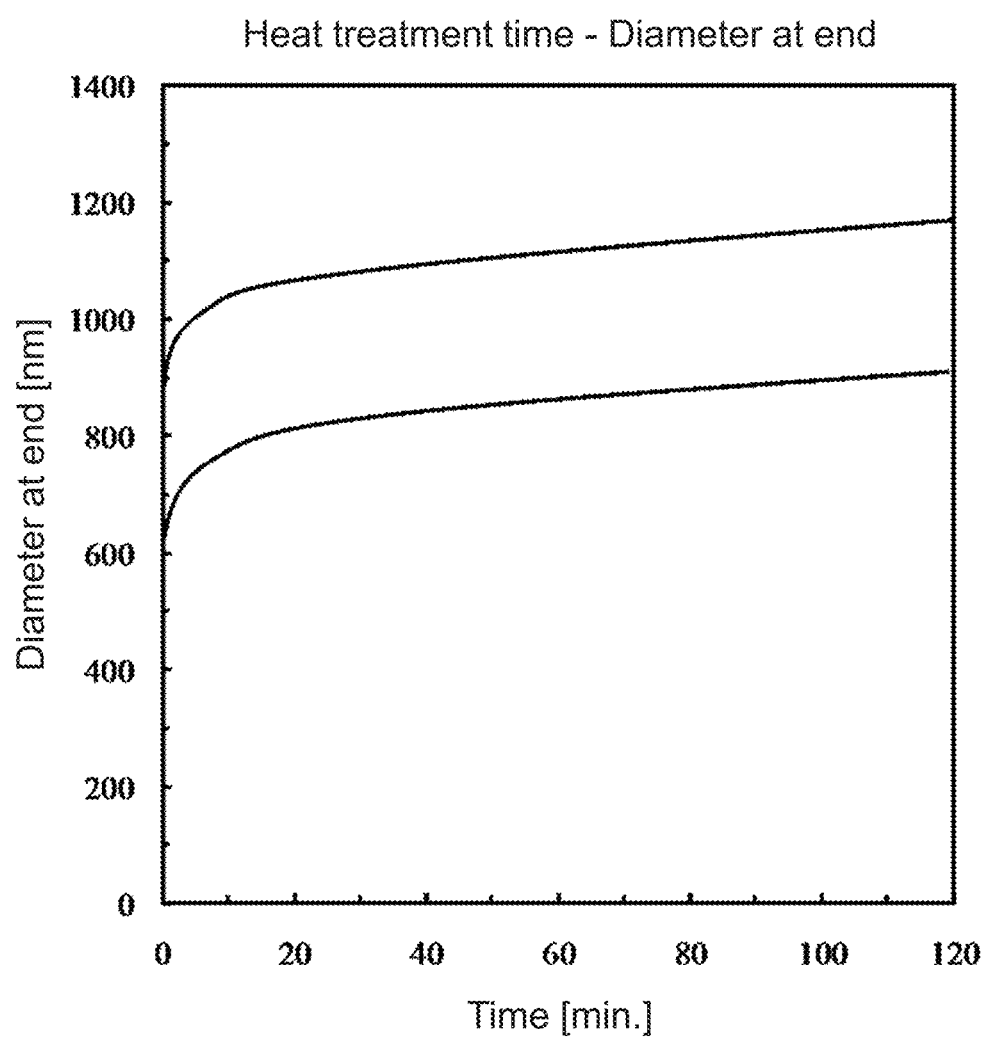
FIG. 15 is a graph illustrating the heat treatment time and a change in diameter at the end.

When intense electric field is applied to the tip end in the method of Embodiment 1, discharge may occur. Actually a tip was broken due to discharge when the processing was performed at 7 kV or more. Then, countermeasure for discharge is required when intense electric field is applied. A generally known method of processing the tip end is heat treatment, and then a tip was processed by a method including heat treatment in combination with the method described in Embodiment 1. In this embodiment, heat treatment was performed at part C of FIG. 11 where the diameter at the tip end is determined in Embodiment 1. FIG. 15 is a graph drawn by plotting a change in diameter at the end of a tip that was heat treated at some temperature T(K) between 2,000 (K) to 2,500 (K). Herein, T(K) is a temperature that does not change the internal structure of a tip, but generates a movement of atoms at the surface only. In FIG. 15, the horizontal axis represents the heat-treated time (minutes), and the vertical axis represents the diameter of tip end (nm). It is found that heating for 120 minutes resulted in a great change of the diameter at the tip end from about 600 nm to about 900 nm, and from about 900 nm to about 1,200 nm. Since the ratio of increase in tip end depends on the diameter of the tip end, the ratio of increase may be investigated beforehand, whereby precision that is obtained in Embodiment 1 will not be degraded. Then this method in combination with Embodiment 1 can manufacture a large tip with a high precision while avoiding discharge. The ratio of increase of the diameter of the tip end can be controlled by adjusting the heating time.

Too high temperatures of heat treatment in this case increase a change of the shape per unit time, and so can shorten the processing time. However, it becomes difficult to control a change of the shape with a high precision. Conceivably a temperature of the heat treatment that is higher than the temperatures used in Embodiment 1 and is in the range from 2,000 K to 2,500 K can control the ratio of increasing the diameter of a tip end for processing. Herein since the time and the temperature of heat treatment depend on the material of a tip, they may be investigated for a material other than tungsten for setting.

Embodiment 5

Figure 16:
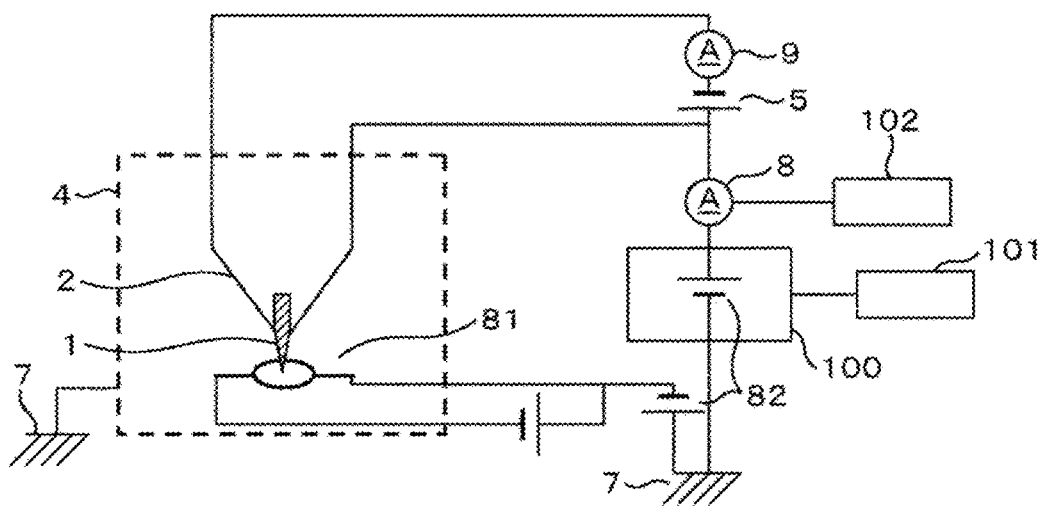
FIG. 16 is a conceptual diagram of a heating device of a tip by a filament.

When the heating element is heated for heat treatment of a tip, the heating element is worn unfortunately. To avoid this problem, the tip may be heated through thermal electrons using a filament 81 that is disposed around the tip. FIG. 16 is a conceptual diagram of the device. Descriptions on parts similar to those in FIG. 2 are omitted. Heat treatment performed as in FIG. 16 can sharpen the tip while avoiding the wearing of the heating element. The filament may have any shape as long as it enables thermal electrons to heat the tip, and voltage may be applied to the tip or the filament so that electric field is generated between the tip and the filament to occur collision of thermal electrons with the tip.

Embodiment 6

Figure 17:
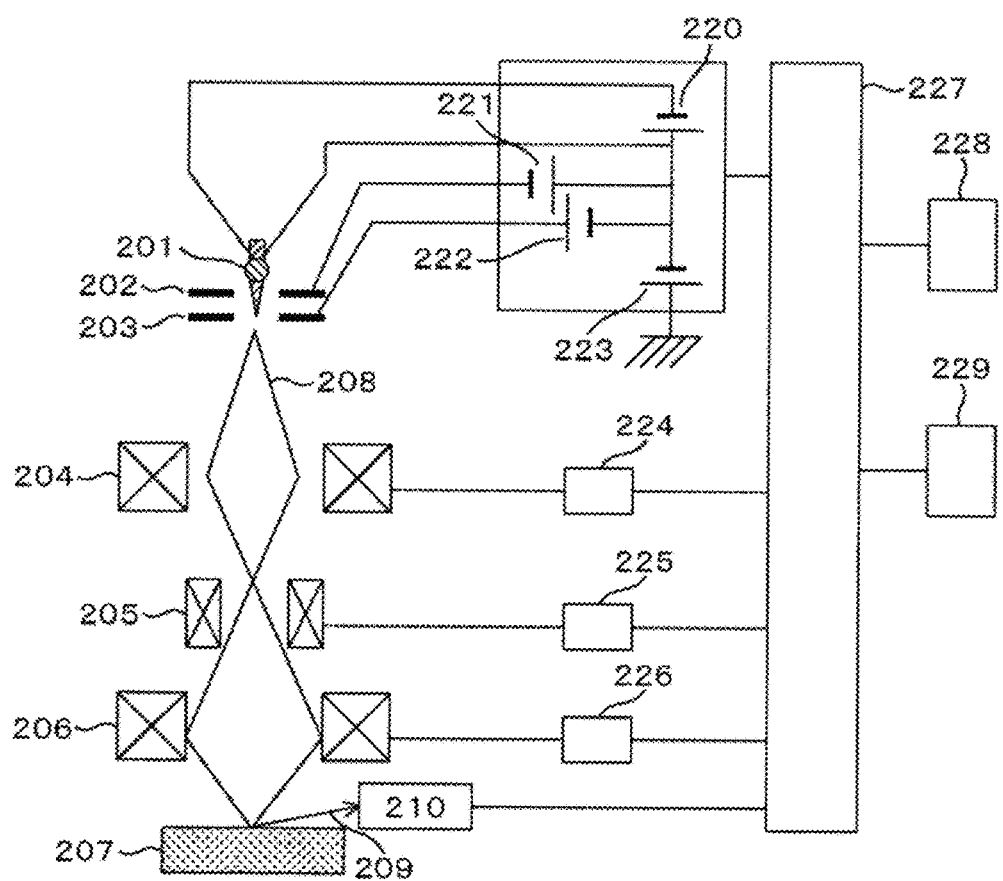
FIG. 17 is a conceptual diagram of a charged particle radiation device.

FIG. 17 is a conceptual diagram illustrating an example where the tip of the present invention is mounted as a Schottky electron source in a charged particle beam device.

In the example illustrated in FIG. 17, zirconium 201 is applied to a <100> tungsten monocrystal tip illustrated in FIG. 2, and a suppresser electrode 202 and an extraction electrode 203 are disposed around the tip, to each of which appropriate voltage is applied under the control of a computer 227 connected to an input device 228 to input electron beam emission conditions. Then, the tip is energized for heating by a current power-supply 220, and electric field is generated at the tip end by an extraction voltage power-supply 222 for emission of primary electrons 208. In the aforementioned Embodiment 1, current output from the current power-supply 220 is measured as the current flowing through the filament during energization of the tip for heating. Among the emitted primary electrons 208, electrons that do not contribute to image formation are limited by suppression voltage that is applied from a suppresser voltage power-supply 221. The remaining electrons are applied to a specimen 207 while having energy supplied from an acceleration voltage power-supply 223. On the way, the electrons are reduced in size with an appropriate magnification by a condenser lens 204 whose coil current is controlled by a condenser lens coil control power-supply 224 and an objective lens 206 whose coil current is controlled by an objective lens coil control power-supply 226, and are scanned over the surface of the specimen 207 by a deflection coil 205. Signal electrons 209 generated at this time are detected by a detector 210, which are then processed by the computer 227, whereby the shape of the surface of the specimen 207 is displayed as an image on a display device 229.

Herein, the tip may be selected so that, when the current of a primary electron beam may be about a few pA due to conditions to observe and analyze the specimen 207, the diameter of the tip at the end may be 800 nm or less, and when large current of a few nA or more is required for low chromatic aberration and high stability, the diameter of the tip at the end may be of a desired size of 800 nm or more.

REFERENCE SIGNS LIST

1 Tip
2 Heating element
3, 203 Extraction electrode
4 Vacuum vessel
5, 220 Current power-supply
6, 82 Voltage power-supply
7 Ground
8, 9 Ammeter
11, 31, 41, 51 Tip end
12, 52 Electric field
32, 62 Electrons
33, 63 Residual gas
34, 64, 73 Ionized residual gas
42, 61 Round tip end of <100> tungsten monocrystal thin wire
71 Atoms moving on the surface
72 Emitted electrons
74 Tip surface
81 Filament
100 Voltage power-supply controller
101, 228 Input device
102 Current display device
201 Zirconium
202 Suppresser electrode
204 Condenser lens
205 Deflection coil
206 Objective lens
207 Specimen 208 Primary electrons
209 Signal electrons
210 Detector
221 Suppresser voltage power-supply
222 Extraction voltage power-supply
223 Acceleration voltage power-supply
224 Condenser lens coil control power-supply
225 Deflection coil control power-supply
226 Objective lens coil control power-supply
227 Computer
229 Display device

The invention claimed is:

1. A method for manufacturing an electron source including: a tip prepared by sharpening an end of a thin wire like a needle; and a heating element to heat the tip, comprising:
disposing the tip and the heating element in a vacuum vessel;
heating the heating element by applying current to the heating element;
applying voltage between the tip and an electrode disposed opposed to the tip and adjusting the voltage based on a relationship acquired beforehand between a diameter of the end and the voltage to process the end of the tip to have a desired size; and
monitoring a variation over time of an amount of emission current from the tip during processing of the tip, and ending the processing of the tip when the emission current becomes constant.

2. The method for manufacturing an electron source according to claim 1, wherein the voltage is adjusted based on a relationship of a first-order linear function between the voltage and a size of the end of the tip after processing so as to process the end of the tip to have a desired size.

3. The method for manufacturing an electron source according to claim 1, wherein the tip is processed so that the diameter of the end is in a range of 0.1 µm or more and 2.0 µm or less.

4. The method for manufacturing an electron source according to claim 1, wherein the tip includes tungsten monocrystal or tungsten polycrystal whose axial orientation is <100>.

5. The method for manufacturing an electron source according to claim 1, wherein
pressure in the vacuum vessel is $10^{-4}$ Pa or more to sharpen the tip.

6. The method for manufacturing an electron source according to claim 1, wherein the tip during processing is heated in a temperature range from 1,500 K to 2,000 K.

7. The method for manufacturing an electron source according to claim 1, wherein processing time of the tip is determined based on current emitted from the tip.

8. The method for manufacturing an electron source according to claim 1, wherein processing is performed so that the end of the tip has a conical part having an angle of 10° or less.

9. The method for manufacturing an electron source according to claim 1, wherein after processing of the end of the tip, the tip is heat-treated in a range from 2,000 K to 2,500 K.

10. The method for manufacturing an electron source according to claim 9, wherein the end of the tip is adjusted in size by changing time of the heat treatment.

11. A method for manufacturing an electron source including: a tip prepared by sharpening an end of a thin wire like a needle; and a heating element to heat the tip, comprising:
disposing the tip and the heating element in a vacuum vessel;
heating the heating element by applying current to the heating element;
applying voltage between the tip and an electrode disposed opposed to the tip and adjusting time to apply the voltage based on a relationship acquired beforehand between a diameter of the end and the time to apply the voltage to process the end of the tip to have a desired size; and
monitoring a variation over time of an amount of emission current from the tip during processing of the tip, and ending the processing of the tip when the emission current becomes constant.

12. The method for manufacturing an electron source according to claim 11, wherein the tip is processed so that the diameter of the end is in a range of 0.1 µm or more and 2.0 µm or less.

13. The method for manufacturing an electron source according to claim 11, wherein the tip includes tungsten monocrystal or tungsten polycrystal whose axial orientation is <100>.

14. The method for manufacturing an electron source according to claim 11, wherein pressure in the vacuum vessel is $10^{-4}$ Pa or more to sharpen the tip.

15. The method for manufacturing an electron source according to claim 11, wherein the tip during processing is heated in a temperature range from 1,500 K to 2,000 K.

16. The method for manufacturing an electron source according to claim 11, wherein processing is performed so that the end of the tip has a conical part having an angle of 10° or less.

17. The method for manufacturing an electron source according to claim 11, wherein after processing of the end of the tip, the tip is heat-treated in a range from 2,000 K to 2,500 K.

18. The method for manufacturing an electron source according to claim 17, wherein the end of the tip is adjusted in size by changing time of the heat treatment.

* * * * *